United States Patent
Chockler et al.

(10) Patent No.: US 8,903,700 B2
(45) Date of Patent: Dec. 2, 2014

(54) CONCRETIZATION OF ABSTRACTED TRACES

(75) Inventors: Hana Chockler, Haifa (IL); Sharon Keidar-Barner, Yokneam Ilit (IL)

(73) Assignee: International Business Machines Corporation, Armonk, NY (US)

( * ) Notice: Subject to any disclaimer, the term of this patent is extended or adjusted under 35 U.S.C. 154(b) by 711 days.

(21) Appl. No.: 12/785,512

(22) Filed: May 24, 2010

(65) Prior Publication Data

US 2011/0218794 A1 Sep. 8, 2011

Related U.S. Application Data

(63) Continuation-in-part of application No. 12/719,019, filed on Mar. 8, 2010, now Pat. No. 8,639,490.

(51) Int. Cl.
*G06F 9/44* (2006.01)
*G06F 13/10* (2006.01)
*G06F 13/12* (2006.01)

(52) U.S. Cl.
CPC .......................................... *G06F 9/44* (2013.01)
USPC .................................. 703/20; 703/13; 703/14

(58) Field of Classification Search
CPC . G06F 17/5022; G06F 9/455; G06F 11/3636; G06F 2221/0737; G06F 17/50; G06F 9/44
USPC ............................................... 703/13, 14, 20
See application file for complete search history.

(56) References Cited

U.S. PATENT DOCUMENTS

| | | | |
|---|---|---|---|
| 6,975,976 B1 | 12/2005 | Casavant et al. | |
| 7,418,680 B2 | 8/2008 | Clarke et al. | |
| 2009/0106737 A1* | 4/2009 | Chockler et al. .............. | 717/126 |
| 2009/0106740 A1 | 4/2009 | Chockler et al. | |

OTHER PUBLICATIONS

Chockler, Hana et al., "Cross-Entropy-Based Replay of Concurrent Programs", Mar. 27, 2009, Springer-Verlag Berlin Heidelberg.*
Satpathy, Manoranjan et al., "Test Case Generation from Formal Models through Abstraction refinement and Model Checking", Jul. 9-12, 2007, AMOST '07, London UK, ACM.*
Chockler, Hana et al., "Cross-Entropy Based Testing", 2007, Seventh International Conference on Formal Methods in Computer-Aided Design, IEEE Computer Society.*
E.M. Clarke et al., "Counterexample-guided Abstraction Refinement". CAV, 2000.
H. Chockler et al., "Cross-Entropy Based Testing". FMCAD, 2007.

(Continued)

*Primary Examiner* — Kamini S Shah
*Assistant Examiner* — Cedric D Johnson
(74) *Attorney, Agent, or Firm* — Ziv Glazberg

(57) ABSTRACT

An abstract trace may be defined based on a coverage goal. An execution of a System Under Test (SUT) is guided in accordance with the coverage goal. Non-deterministic decision, which correlates to receiving a stimulus to the SUT, is decided based on a probability function. After one or more executions, the probability function is modified based on a measurement of similarity between the abstract trace and each of the one or more executions. The modification of the probability function may be performed using on Cross-Entropy method. The modification is performed in order to cause determination of non-deterministic decisions in executions to better correlate with the abstract trace. In some exemplary embodiments, a determination whether the abstract trace is reachable is determined based on a rate of convergence of the executions to the abstract trace.

14 Claims, 4 Drawing Sheets

(56) References Cited

OTHER PUBLICATIONS

H. Chockler et al., "Cross-Entropy Based Replay of Concurrent Programs". FASE, 2009.

L.M. Schmitt. "Theory of Genetic Algorithms", Theoretical Computer Science 259: 1-61, 2001.

E.M. Rudnick et al., "Sequential circuit test generation in a genetic algorithm framework", in the Proceedings of DAC 1994.

E.M. Rudnick et al., "Application of simple genetic algorithms to sequential circuit test generation", in Proceedings of DATE 1994.

I. Pomeranz et al., "A Cone-Based Genetic Optimization Procedure for Test Generation and Its Application to non-Detections in Combinational Circuits", in IEEE Transactions on Computers, v.48 n.10, p. 1145-1152, Oct. 1999.

I. Pomeranz et al., "On improving genetic optimization based test generation", in Proceedings of DATE 1997.

F. Corno et al., "Advanced Techniques for GA-based sequential ATPGs", Proceedings of DATE 1996.

\* cited by examiner

CONCRETIZATION OF ABSTRACTED TRACES

CROSS REFERENCE TO RELATED APPLICATIONS

This application is a continuation in part of prior patent application Ser. No. 12/719,019, filed Mar. 8, 2010, the content of which is hereby incorporated by reference.

BACKGROUND

The present disclosure relates to verification techniques, in general, and to improving coverage of a verification process in particular.

Computerized devices are an important part of modern life. They control almost every aspect of our life—from writing documents to controlling traffic lights. However, computerized devices are bug-prone, and thus require a verification phase in which the bugs should be discovered. The verification phase is considered one of the most difficult tasks in developing a computerized device. Many developers of computerized devices invest a significant portion, such as 70%, of the development cycle to discover erroneous behaviors of the computerized device, also referred to as a target device. The target device may comprise hardware, software, firmware, a combination thereof and the like.

The verification phase may be useful in finding bugs in both software and hardware (and combination thereof). Dynamic verification methods such as hardware simulation and software testing are the primary means of verifying the correctness of hardware and software. These methods are scalable and relatively easy to use. However, they have limited coverage and hence may miss critical corner bugs. This is especially true when the bugs are very rare. The common approach to maximizing coverage of simulation-based tools is to (manually) define a coverage model, which is a list of coverage goals which are then passed to simulation. A simulation process is complete when all coverage goals are reached. In the present disclosed subject matter, hardware simulation and software testing are both referred to as simulation. Simulation of hardware execution may be performed using a model of the hardware. Verification of software execution may be performed executing the software. In both cases, a stimulus may be utilized to force the System Under Test (SUT), be it software or hardware, to perform different functionalities. As only a portion of all possible stimuli are checked, determining a coverage measurement may be useful in understanding whether or not to continue performing verification. A stimulus may be input to the SUT from a user, an external component, an environment or the like. For example, a stimulus may be a scheduling decision on threads of the software, clock signal to the hardware or the like.

SUMMARY

One exemplary embodiment of the disclosed subject matter is a computer-implemented method for guiding a simulation of a System Under Test (SUT) to reach a coverage goal, the method comprising: receiving a coverage goal associated with the SUT; simulating an execution of the SUT using a processor; the simulating the execution of the SUT comprises: performing at least one non-deterministic decision of the SUT based on a probability function; and producing a trace of the simulated execution; the method further comprises: determining a measurement of similarity between the trace and an abstract trace covering the coverage goal; and in response to the determining the measurement of similarity, modifying the probability function.

Another exemplary embodiment of the disclosed subject matter is a computerized apparatus for guiding a simulation of a System Under Test (SUT) to reach a coverage goal, the computerized apparatus having a processor, the computerized apparatus comprising: a receiver configured to receive a coverage goal associated with the SUT; a probability module configured to determine at least one non-deterministic decision associated with the target device based on a probability function; a simulation module configured to simulate an execution of the SUT and produce a trace of the simulated execution, the simulation module is configured to utilize the probability module to determine the at least one non-deterministic decision; a similarity estimation module configured to determine a measurement of similarity between the trace and an abstract trace covering the coverage goal; and a probability function modifier configured to modify the probability function utilized by the probability module based on the measurement of similarity determined by the similarity estimation module.

Yet another exemplary embodiment of the disclosed subject matter is a computer program product for guiding a simulation of a System Under Test (SUT) to reach a coverage goal, the computer program product comprising: a non-transitory computer readable medium; a first program instruction for receiving a coverage goal associated with the SUT; a second program instruction for simulating an execution of the SUT; wherein the second program instruction comprising: a third program instruction for performing at least one non-deterministic decision of the SUT based on a probability function; a fourth program instruction for producing a trace of the simulated execution; a fifth program instruction for determining a measurement of similarity between the trace and an abstract trace covering the coverage goal; a sixth program instruction for modifying the probability function in response to determination of the measurement of similarity by the fifth program instruction; and wherein the first, second, third, fourth, fifth and sixth program instructions are stored on the non-transitory computer readable medium.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
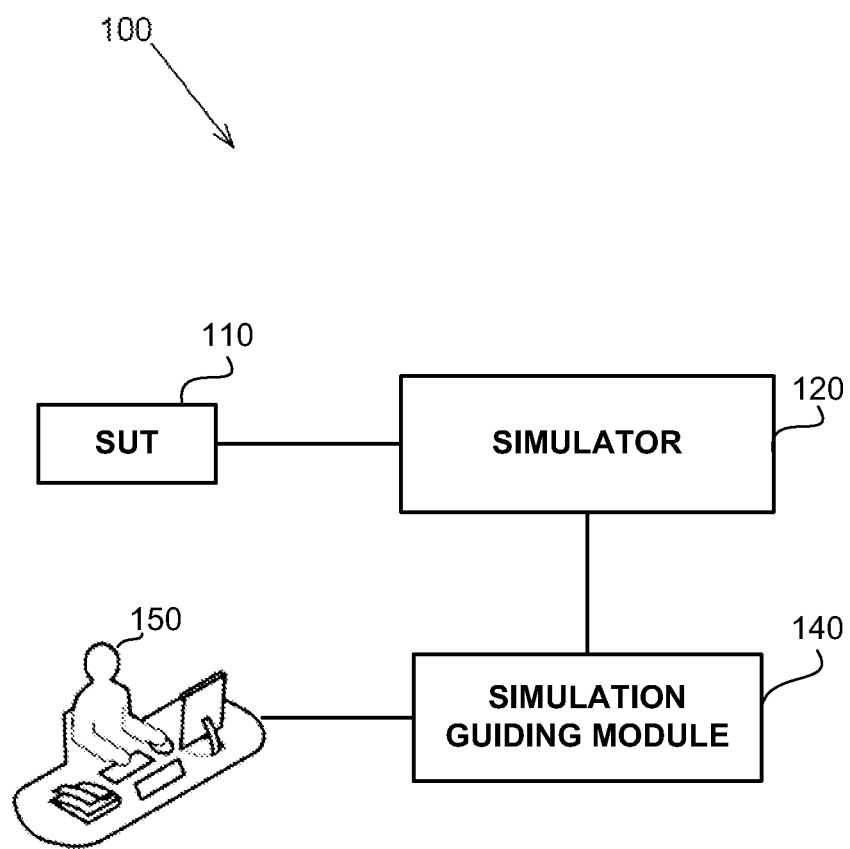
FIG. 1 shows a computerized environment in which the disclosed subject matter is used, in accordance with some exemplary embodiments of the subject matter.

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to improve a coverage measurement of a verification process. Another technical problem dealt with by the disclosed subject matter is to guide an execution of SUT towards a predetermined coverage goal.

One technical solution is to define an abstract trace covering the coverage goal and to guide a simulation of the SUT to converge with the abstract trace. Guidance of the simulation may be performed by enabling a simulator to determine non-deterministic decision based on a probability function, and by modifying the probability function based on a measurement of similarity between the abstract trace and a trace of the simulation. A cross-entropy method may be utilized to modify the probability function to be more likely to reach the abstract trace. Another technical solution is to measure a rate of convergence to the abstract trace and to determine based on the rate of convergence whether the coverage goal is reachable or unreachable. In case the rate of convergence falls below a threshold, such as a less than 10% improvement between two iterations, the coverage goal may be indicated as a possibly unreachable coverage goal.

One technical effect of utilizing the disclosed subject matter is to enable determination of a concrete trace covering the coverage goal. The coverage goal may be transformed into an abstract trace. A simulation of the SUT may be enabled to provide simulated executions of the SUT that are biased towards fulfilling the coverage goal.

Referring now to FIG. 1 showing a computerized environment in which the disclosed subject matter is used, in accordance with some exemplary embodiments of the subject matter. A computerized environment 100 may comprise an SUT 110 and a simulator 120.

In some exemplary embodiments, the SUT 110 may be a hardware component, a software component, a combination thereof, or the like. The SUT 110 may be associated with a model, such as defined by a descriptive language, such as for example SystemC, Verilog, GDL, Sugar or the like. In some exemplary embodiments, the SUT 110 may or may not be operational, such as for example a circuit not yet fabricated, a software module that utilizes an interface that is not yet implemented and the like.

In some exemplary embodiments, the simulator 120 may simulate execution of the SUT 110. The simulator 120 may track whether a simulated execution covers a coverage goal. A coverage goal may define a state, or a partial state, that should be reached in some trace exercised by simulator 120. A coverage goal may be a set of states (e.g., first reach state 1 and then reach state 2). A state may be defined by values of attributes of the SUT 110. For example, the state may be values of signals, latches, flip-flops or the like of a hardware component. As another example, the state may be values of registers, variables, program counters or the like of a software component. A coverage goal is said to be covered if the simulator 120 simulates an execution of the SUT 110 and during the execution all one or more states (or partial states) of the coverage goal are reached.

In some exemplary embodiments, a simulation guiding module 140 may be configured to guide an simulated execution of the SUT 110 by the simulator 120 to cover a coverage goal. The simulation guiding module 140 may be configured to receive input from a user 150 indicating at least one coverage goal to cover. The simulation guiding module 140 may be configured to guide the simulator 120 by determining stimuli to provide the simulator 120. In some exemplary embodiments, the simulation guiding module 140 may determine the stimuli by stochastically determining possible stimuli based on a probability function.

Figure 2:
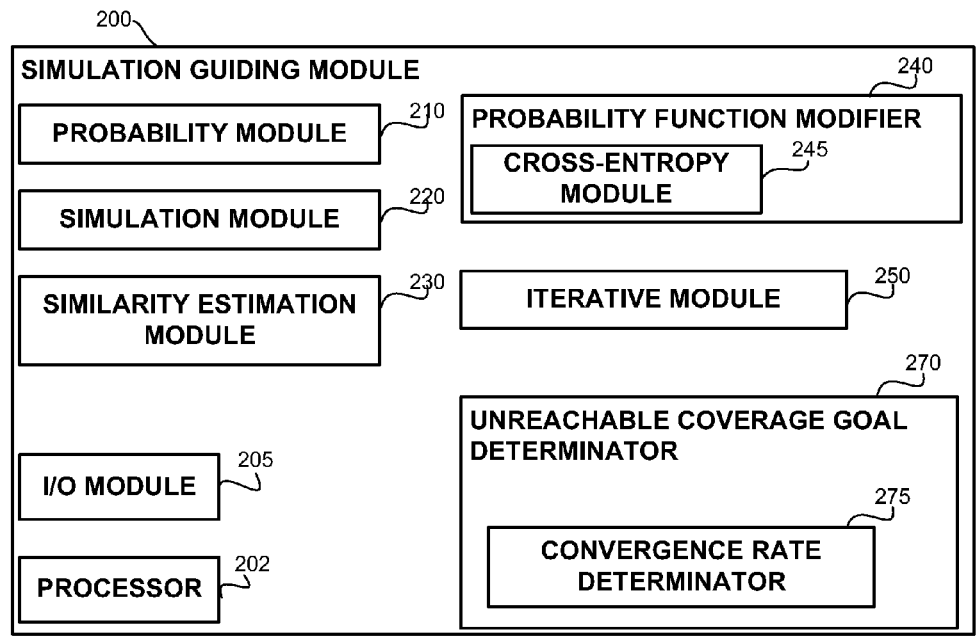
FIG. 2 shows a block diagram of a simulation guiding module, in accordance with some exemplary embodiments of the disclosed subject matter.

Referring now to FIG. 2 showing a block diagram of a simulation guiding module, in accordance with some exemplary embodiments of the disclosed subject matter. A simulation guiding module 200, such as for example 140 of FIG. 1, may be configured to determine a trace associated with a SUT, such as 110 of FIG. 1, and with a coverage goal. The simulation guiding module 200 may guide a simulation process so as to reach to coverage goal.

In some exemplary embodiments, the simulation guiding module 200 may comprise a probability module 210. The probability module 210 may be configured to determine a non-deterministic decision. The non-deterministic decision may be associated with an execution of the SUT, a simulation of such execution or the like. The probability module 210 may utilize a probability function to determine a probability of determining each possibility of the possibilities of the non-deterministic decision. In some exemplary embodiments, a non-deterministic decision may be a non-deterministic value of an input, also referred to as non-deterministic input. The input may be received by the SUT from an environment. The input may be received from a user, a component of a system integrated with the SUT, a library function, a function returning random or pseudo-random values, or the like. The input may be non-deterministic from a view point of the SUT. The input may be a value of a predetermined type, a predetermined range or the like. For example, the input may be a value of an ENUM type. As another example, the input may be a 32-bit value. In some exemplary embodiments, a non-deterministic decision may be a scheduling decision such as performed by a concurrent computer program. The scheduling decision may select one entity of a set of possible entities to become active and be executed. The entities may be various executable entities such as threads, processes or the like.

In some exemplary embodiments, a simulation module 220, such as simulator 120 of FIG. 1, may be configured to simulate an execution of the SUT. The simulation module 220 may utilize the probability module 210. An execution of the SUT may be configured to decide non-deterministic decisions based on the probability function of the probability module 210. In some exemplary embodiments, the simulation module 220 may simulate execution of the SUT and determine a non-deterministic decision based on the probability function.

In some exemplary embodiments, a similarity estimation module 230 may be configured to determine a measurement of similarity between a first and second simulated executions, also referred to as executions. The first execution may be an execution of an abstract trace that covers the coverage goal. The second execution may be an execution determined by the simulated module 220. The first and second executions may be traces, logs, descriptive characterization of the execution or the like. A measurement of similarity between two executions may be determined based on various parameters. As one example, similarity may be determined based on a computation of a distance between control graphs of the two executions. As another example, similarity may be determined based on a computation of difference between decisions determined in associated non-deterministic decisions. See also Hana Chockler, Eitan Farchi, Benny Godlin, and Sergey Novikov: Cross-Entropy-Based Replay of Concurrent Programs. FASE 2009: 201-215, which is incorporated by reference herein.

In some exemplary embodiments, a probability function modifier 240 may be configured to modify the probability function of the probability module 210. The probability function modifier 240 may modify the probability function in response to a determination of measurement of similarity by the similarity estimation module 230. In some exemplary embodiments, the probability function may be modified such that it may be more likely that an execution of the SUT that utilizes the modified probability function will be similar to a trace than an execution performed using the probability function. Various techniques may be utilized to perform such a modification such as for example cross-entropy method, genetic algorithm, simulated annealing, swarming and the like.

In some exemplary embodiments, a cross-entropy module 245 may be utilized by the probability function modifier 240. The cross-entropy module 245 may be utilized to determine cross-entropy based on the measurement of difference between the abstracted execution and the execution invoked by the execution module 220. The cross-entropy module 245 may be utilized to perform the cross-entropy method, as is known in the art.

In some exemplary embodiments, an iterative module 250 may be configured to perform an iterative process. In some exemplary embodiments, the iterative process is the cross-entropy method. In some exemplary embodiments, the iterative process is an optimization of a target function, where the target function is assigned a highest value when the execution and the abstracted execution are identical. Other iterative processes may be used. The iterative module 250 may initiate iteratively the simulation module 220 to provide an execution, invoke the similarity estimation module 230 to determine a measure of similarity between the execution and an abstracted execution. The iterative module 250 may further invoke during an iteration the probability function modifier 240 to modify the probability function that may be used by the simulation module 220 in a successive iteration.

In some exemplary embodiments, an unreachable coverage goal determinator 270 may be configured to determine that the coverage goal is unreachable. The unreachable coverage goal determinator 270 may perform such a determination based on a performing a predetermined number of simulations by the simulation module 220, utilizing a predetermined amount of resources such as memory and time, or the like. It will be noted that the unreachable coverage goal determinator 270 may perform an estimation only and may erroneously determine that a coverage goal is unreachable. It will be further noted however that the disclosed subject matter provides a relatively low-resource technique to provide for a relatively reasonable estimation, as opposed to other techniques which require large amounts of resources and may be infeasible due to the state-space explosion problem.

In some exemplary embodiments, the unreachable coverage goal determinator 270 may comprise a convergence rate determinator 275. The convergence rate determinator 275 may determine a convergence rate in similarity between executions and an abstract execution that covers the coverage goal. The convergence rate may be determined based on a slope in a curve measuring similarity of executions to the abstract execution over time. In case a convergence rate decreases rapidly, a determination may be made that the coverage goal is unreachable.

In some exemplary embodiments of the disclosed subject matter, the simulation guiding module 200 may comprise an Input/Output (I/O) module 205 utilized for receiving input to and providing output from the simulation guiding module 200.

In some exemplary embodiments, the concrete trace determinator 200 may comprise a processor 202. The processor 202 may be a Central Processing Unit (CPU), a microprocessor, an electronic circuit, an Integrated Circuit (IC) or the like. The processor 202 may be utilized to perform computations required by the concrete trace determinator 200 or any of it subcomponents.

Figure 3:
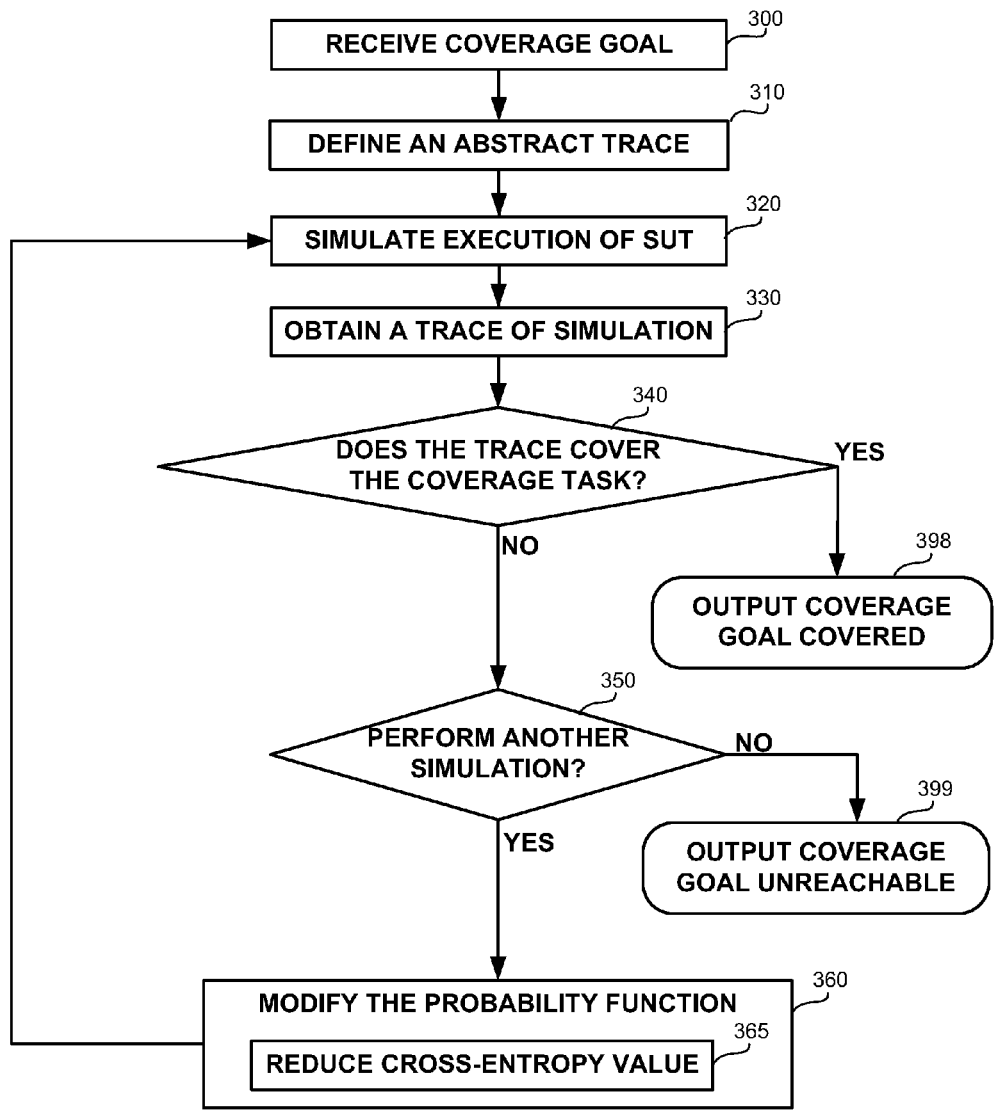
FIG. 3 shows a flowchart diagram of a method, in accordance with some exemplary embodiments of the disclosed subject matter.

Referring now to FIG. 3 showing a flowchart diagram of a method, in accordance with some exemplary embodiments of the disclosed subject matter. The method of FIG. 3 may be performed by a concrete trace determinator, such as 200 of FIG. 2.

In step 300, a coverage goal may be received. The coverage goal may be received from a user, such as a verification engineer, a developer, a QA staff member or the like, by an I/O module, such as 205 of FIG. 2.

In step 310, an abstract trace may be defined. The abstract trace may be defined based on the coverage goal. The abstract trace may be determined by a simulation guiding module, such as 200 of FIG. 2. In some exemplary embodiments, an abstracted model of the SUT may be determined (either manually or automatically). Using static analysis methods, such as model checking, dynamic analysis methods, such as simulation, or the like may be utilized to traverse the abstracted model and to determine an abstracted trace covering the coverage goal. In some cases of an unreachable coverage goal, even using the abstracted model, the coverage goal is unreachable. Therefore, identification of such an unreachable coverage goal may be relatively easy. In some cases, the abstracted trace may comprise one or more partial states defined by the coverage goal without prior traversal of an abstracted model of the SUT.

In step 320, a simulated execution of the SUT may be performed. A simulation module, such as 220 of FIG. 2, may perform the simulation. Any non-deterministic decision taken by the SUT may be simulated using a probability function, such as maintained by a probability module 210 of FIG. 2.

In step 330, a trace of the simulation may be obtained.

In step 340 a determination is made whether or not the trace of step 330 covers the coverage task. In some exemplary embodiments, a determination whether or not the trace and the abstract trace of step 310 are similar is performed. The determination may be based on a predetermined range of similarity measurement. The determination may be made based on the measurement of similarity determined by a similarity estimation module, such as 230 of FIG. 2. In case the traces are similar enough, an output that the coverage goal was covered may be provided in step 398.

In other exemplary embodiments, in step 350 a determination whether or not another simulation should be performed may be determined. The determination may performed by an unreachable coverage goal determinator, such as 270 of FIG. 2. In some exemplary embodiments, in case additional simulations should be performed, step 360 may be performed. In some exemplary embodiments, step 320 may be performed. In some exemplary embodiments, a predetermined number of simulations may be performed before step 360 is performed. For example, once every one two hundred simulations, step 360 may be performed.

In case another iteration is not to be performed, step 399 may be performed and an output may be provided. The output may indicate that the coverage goal is deemed unreachable.

In case another iteration is to be performed, step 360 may be performed. In step 360 the probability function utilized in simulated execution of the SUT In some exemplary embodiments, step 360 may comprise step 365. In step 365 a reduction to the cross entropy value is performed. The cross-entropy value may be determined by a cross-entropy module, such as 245 of FIG. 2. The probability function may be modified to reduce the cross-entropy value by the cross-entropy module.

Figure 4:
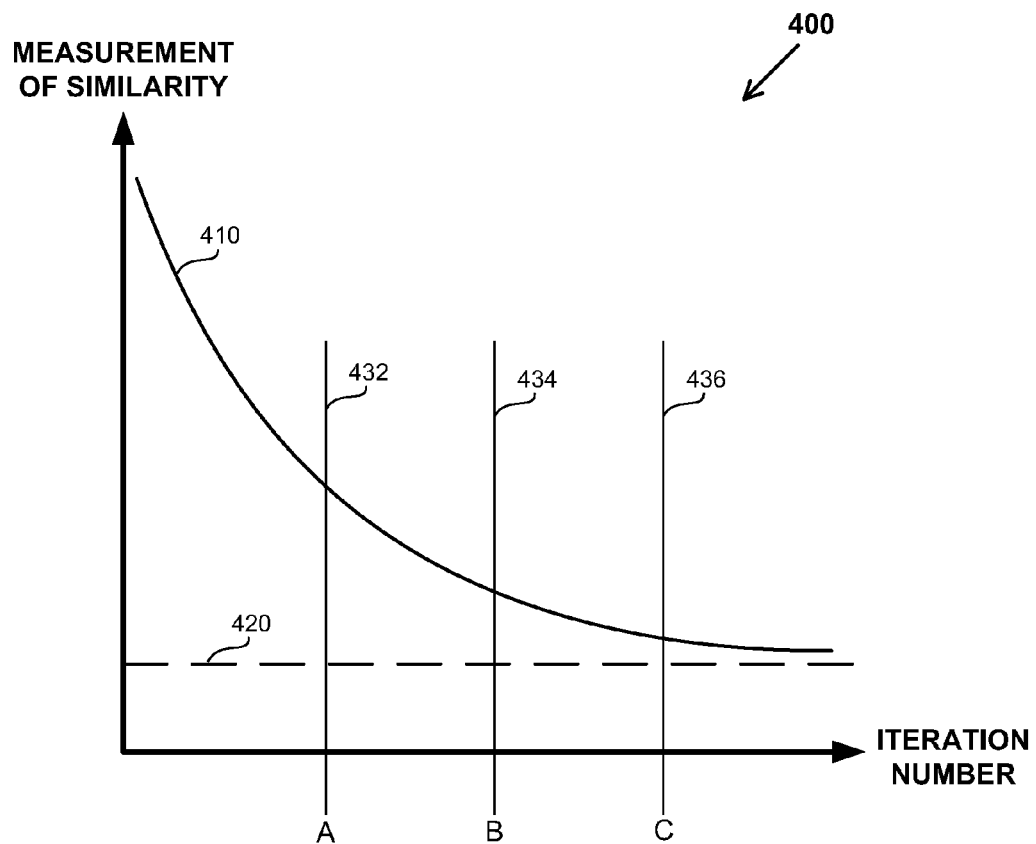
FIG. 4 shows a curve exemplifying a scenario in which a coverage goal cannot be covered, in accordance with some exemplary embodiments of the disclosed subject matter.

Referring now to FIG. 4 showing a curve exemplifying a scenario in which a coverage goal cannot be covered, in accordance with some exemplary embodiments of the disclosed subject matter. A graph 400 shows measurement of similarity between simulated executions and an abstract trace covering the coverage goal in respect to an iteration number of a method in accordance with the disclosed subject matter. A curve 410 shows that over time (e.g., as the method proceeds and the simulated executions are guided towards the coverage goal), the measurement of similarity converges to a threshold 420. It will be noted that the lower the measurement the more similar two traces. For example, the measurement may be calculated based on a distance between states in the simulated execution and between states in the abstract trace. As the measurement does not decrease below the threshold 420, the coverage goal is not deemed as covered.

The disclosed subject matter may identify that the coverage goal is unreachable (or determine that the coverage goal is unreachable in spite of the coverage goal being reachable) by identifying that the slop of the curve 410 decreases and it converges to the threshold 420. A decrease in the measurement of similarity value between points A 432 and B 434 is bigger than the decrease between points B 434 and C 436. In some exemplary embodiments, the distance from point C 436 to point B 434 in the x-axis is at least the distance between point C 434 and point A 432 in the x-axis.

The decrease in the slop may be identified, and used to determine that the measurement of similarity converges to the threshold 420. In some exemplary embodiments, the function represented by the curve 410 is smooth, and therefore in case a coverage goal is reachable, a convergence to a threshold, such as 420, should not occur. In some exemplary embodiments, the function is not smooth and a convergence may occur before an additional reduction in the measurement that represents covering the coverage goal.

The disclosed subject matter may be utilized to increase coverage in simulation. In some exemplary embodiments, given a coverage model, a trace of a coverage goal may be determined based on an abstract model. Cross-entropy based method may be applied to determine a concrete trace that may correspond to the abstract trace. The concrete trace covers the coverage goal. In some exemplary embodiments, the abstract trace may be determined using static analysis methods. In some exemplary embodiments, the abstract trace may be determined by performing simulation on the abstraction.

Some exemplary embodiments of the disclosed subject matter may be deemed scalable, as dynamic methods, and having effectiveness of static analysis methods. Some exemplary embodiments of the disclosed subject matter may be sound—coverage may be reported only in case the coverage goal is truly covered. Some exemplary embodiments of the disclosed subject matter may be not complete—in theory, there can be a situation in which a simulated execution that covers the coverage goal is not determined, though it exists. However, the cross-entropy method may be considered to be highly effective and reliable in finding rare executions, and in practice the disclosed subject matter may be expected to cover all coverage goals that can be covered.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method for guiding a simulation of a System Under Test (SUT) to reach a coverage goal, the method comprising:
   receiving a coverage goal associated with the SUT;
   simulating an execution of the SUT using a processor; said simulating the execution of the SUT comprises:
      performing at least one non-deterministic decision of the SUT based on a probability function;
   determining a measurement of similarity between a trace obtained from the simulated execution and an abstract trace covering the coverage goal, wherein the abstract trace is a trace obtained from an execution of an abstracted model of the SUT; and
   in response to said determining the measurement of similarity, modifying the probability function;
   determining a convergence rate of the trace to the abstract trace based upon at least three measurements of similarity; wherein the convergence rate is defined as a rate of improvement in similarity; and
   in respect to the convergence rate falling below a threshold of less than 10% improvement between two iterations, outputting an indication that the coverage goal is not reachable,
   wherein said simulating the execution of the SUT, said determining the measurement of similarity, and said modifying the probability function are performed iteratively.

2. The method of claim 1, wherein the iterative steps are performed until the measurement of similarity is within a predetermined range.

3. The method of claim 1, wherein the SUT is selected from a group consisting of a software component and a hardware component.

4. The method of claim 1, wherein the at least one non-deterministic decision is selected from the group consisting of a scheduling decision and a decision on non-deterministic input.

5. The method of claim 1, wherein said modifying the probability function comprises reducing a cross-entropy measurement.

6. The method of claim 1, wherein said determining the measurement of similarity comprises determining a value of a distance function, wherein the value of the distance function is indicative of a difference between a first control graph of the execution of the SUT and a second control graph of the execution of the abstracted model of the SUT.

7. A computerized apparatus for guiding a simulation of a System Under Test (SUT) to reach a coverage goal, the computerized apparatus having a processor, the computerized apparatus comprising:
   a receiver module configured to receive a coverage goal associated with the SUT;
   a probability module configured to determine at least one non-deterministic decision associated with the target device based on a probability function;
   a simulation module configured to simulate an execution of the SUT and produce a trace of the simulated execution, said simulation module is configured to utilize said probability module to determine the at least one non-deterministic decision;
   a similarity estimation module configured to determine a measurement of similarity between the trace and an abstract trace covering the coverage goal, wherein the abstract trace is a trace obtained from an execution of an abstracted model of the SUT;

a probability function modifier configured to modify the probability function utilized by said probability module based on the measurement of similarity determined by said similarity estimation module;

an iterative module configured to initiate said simulation module, said similarity estimation module and said probability function modifier iteratively;

an unreachable coverage goal determinator module configured to determine that the coverage goal is not reachable based upon the measurement of similarity;

wherein said unreachable coverage goal determinator module comprises a convergence rate determinator module configured to determine a convergence rate; and wherein said unreachable coverage goal determinator module is configured to determine that the coverage goal is not reachable based upon the convergence rate falling below a threshold of less than 10%.

8. The computerized apparatus of claim 7, wherein said probability function modifier comprises a cross-entropy module.

9. The computerized apparatus of claim 7, wherein the SUT is selected from a group consisting of a software component and a hardware component.

10. The computerized apparatus of claim 7, wherein the at least one non-deterministic decision is selected from the group consisting of a scheduling decision and a decision on non-deterministic input.

11. A computer program product for guiding a simulation of a System Under Test (SUT) to reach a coverage goal, the computer program product comprising a non-transitory computer readable medium containing program instructions executable by a processor;

a first program instruction for receiving a coverage goal associated with the SUT;

a second program instruction for simulating an execution of the SUT; wherein said simulating comprises performing at least one non-deterministic decision of the SUT based on a probability function;

a third program instruction for determining a measurement of similarity between a trace obtained from the simulated execution and an abstract trace covering the coverage goal, wherein the abstract trace is a trace obtained from an execution of an abstracted model of the SUT;

a fourth program instruction for modifying the probability function in response to determination of the measurement of similarity by said third program instruction;

a fifth program instruction for performing said second, third and fourth program instructions iteratively;

a sixth program instruction for determining a convergence rate of the trace to the abstract trace based upon at least three measurements of similarity; wherein the convergence rate is defined as a rate of improvement in similarity; and a seventh program instruction for outputting an indication that the coverage goal is not reachable subject t to the convergence rate falling below a threshold of less than 10% improvement between two iterations, wherein said first, second, third, fourth, fifth, sixth and seventh program instructions are stored on said non-transitory computer readable medium.

12. The computer product of claim 11 wherein said fifth program instruction comprises an eighth program instruction for determining whether the measurement of similarity performed is within a predetermined range; and wherein said fifth program instruction is for performing said second, third and fourth program instructions iteratively until the measurement of similarity is within the predetermined range.

13. The computer product of claim 11, wherein the at least one non-deterministic decision is selected from the group consisting of a scheduling decision and a decision on non-deterministic input.

14. The computer product of claim 11, wherein said fourth program instruction comprises a seventh program instruction for reducing a cross-entropy measurement.

* * * * *